United States Patent [19]

Spiegel

[11] 4,364,045

[45] Dec. 14, 1982

[54] DIGITIZED DISPLACEMENT TRANSDUCER

[75] Inventor: Leo Spiegel, Sharon, Mass.

[73] Assignee: Northrop Corporation, Los Angeles, Calif.

[21] Appl. No.: 240,107

[22] Filed: Mar. 3, 1981

[51] Int. Cl.$^3$ .......................... G01B 7/00; G08C 19/08
[52] U.S. Cl. ............................... 340/870.31; 324/208; 340/347 AD
[58] Field of Search ...................... 340/870.31, 870.35, 340/870.36, 347 P, 347 AD, 671, 672; 324/173, 174, 175, 207, 208, 225, 243; 318/660; 336/45

[56] References Cited

U.S. PATENT DOCUMENTS

| | | |
|---|---|---|
| 2,902,765 | 9/1959 | Chater . |
| 3,092,718 | 6/1963 | Wullert . |
| 3,678,380 | 7/1972 | Erben et al. |
| 3,681,687 | 8/1972 | Erben et al. |
| 3,710,265 | 1/1973 | Gray . |
| 3,728,565 | 4/1973 | O'Callaghan . |
| 3,803,567 | 4/1974 | Pezzlo et al. |
| 3,810,136 | 5/1974 | Lang et al. |
| 3,922,671 | 11/1975 | Tripp . |
| 3,961,243 | 6/1976 | Schulz . |
| 4,013,986 | 3/1977 | Weckenmann . |
| 4,039,929 | 8/1977 | Weckenmann . |
| 4,112,366 | 9/1978 | Kouril et al. |
| 4,140,998 | 2/1979 | Bettle . |
| 4,181,884 | 1/1980 | Shirasaki et al. |

Primary Examiner—Thomas A. Robinson
Attorney, Agent, or Firm—Kenway & Jenney

[57] ABSTRACT

A displacement measuring transducer performs a direct conversion of changes in physical position, particularly angular position, into a digital form suitable for input to a digital microprocessor. The transducer is of the inductive type. Two inductance legs are connected at a common input to form a three-terminal bridge device. To sense positional changes, a step voltage is applied to the input and the transient response at the output of each leg is sampled periodically. Digital circuitry compares the responses of each leg to a fixed reference voltage and produces a binary digital count proportional to the motion sensed by the transducer. This transducer provides high resolution and low noise over a wide dynamic range. It also allows temperature compensation and scale factor calibration.

11 Claims, 2 Drawing Figures

DIGITIZED DISPLACEMENT TRANSDUCER

BACKGROUND OF THE INVENTION

The present invention relates to angular and linear displacement and position measurement. More specifically it relates to a differential inductive transducer that translates motion directly into a digital output with a high degree of resolution and low noise.

Angular displacement transducers are widely used in gyros and accelerometers. One problem of such devices is interfacing the transducer with a microprocessor that performs guidance and navigation functions. For servoed rate-integrating instruments this interfacing is presently performed by costly digitized servo electronics. In mechanically simpler and less expensive spring-restrained instruments the interface problem is more difficult since the output of these devices is usually an analog carrier-modulated sine wave.

A common electromechanical device is an inductive displacement transducer. In its typical configuration, either in the rotary or linear form, very small changes in position are sensed by means of variable electrical coupling between a rotor element and a stator element. In one such device one of the transducer elements is supplied with an alternating current (AC) electrical signal, and an Ac electrical signal is generated across the other element. The amplitude of the signal is a function of the relative position of the rotor with respect to the stator. In another such device, the phase difference between the two AC signals is measured rather than the amplitude.

While such devices are in wide use, they produce an analog output which must interface with a digital processor. Numerous difficulties in this interfacing reduce the accuracy of the digital representation of the displacement. The resulting AC signal is low-amplitude and subject to noise thus requiring extensive shielding, amplification, buffering, demodulation, filtering and conversion from analog to digital form. This electronic processing must normally be performed by discrete circuitry located outside the instrument. Further, to provide an acceptable resolution, typically 1 part in $10^4$ to $10^5$, it is necessary to employ a relatively high precision, high-cost, analog-to-digital converter with a wide dynamic range. Yet another problem is that calibration and temperature and scale-factor compensation has to be provided by complex, peripheral equipment and usually necessitates manual measurements and settings. The requirement for such additional circuitry increases system cost, weight and size while reducing system reliability.

It is therefore a principal object of this invention to provide a differential displacement transducer that translates displacement, whether angular or linear, directly into a digitized output.

Another principal object is to provide such a transducer that is characterized by a high degree of resolution and low noise over a wide dynamic range.

Another object is to provide a transducer with the foregoing advantages that is readily adapted to automatic compensation for temperature and scale-factor variations.

A further object is to provide a transducer with the foregoing advantages that is compact and can be housed as a unit with other components of the measuring instrument.

Yet another object is to provide a transducer with the foregoing advantages that has a competitive cost of manufacture, particularly one which utilizes low cost, monolithic electronic components.

SUMMARY OF THE INVENTION

A differential, inductive electro-mechanical position sensing transducer is configured as a three-terminal bridge device with two inductive legs connected at a common input. A medium-frequency step voltage is applied to the input of both legs. This excitation signal produces a transient response output from each leg that is a function of the time constant of the leg (which, in part, is a function of its inductance). The inductance varies with changes in mechanical position.

The transient output responses of each leg are synchronously sampled and converted into digital timing signals by comparison of the transient responses with a fixed reference voltage that is preferably a selected ratio of the voltage step producing the excitation. This novel use of step-voltage excitation and this processing of the induced transient response obviates the need to employ cumbersome and expensive analog-to-digital circuitry of conventional modulated analog waveform devices.

In a preferred embodiment of the invention, a low-cost monolithic comparator is used to effect this comparison and, in conjunction with other low-cost monolithic synchronous logic elements, clocks and counters provides a high-resolution, low noise readout of the sensor timing signals. By proper circuit design, with partitioning and shielding to control noise, these timing circuits may be physically incorporated in close proximity of the instrument. As a result an instrument such as a spring restrained gyro or an accelerometer can directly provide output of a digital signal that is a function of angular rate or linear acceleration. Interface with a guidance and navigation microprocessor can be by way of a set of monolithic up/down counters that convert the timing signals into a binary count which represents a change in angle or velocity. A method and system for thermal correction over the full scale of operation of the instrument and over a wide temperature range is also described.

DESCRIPTION OF PREFERRED EMBODIMENT

Figure 1:
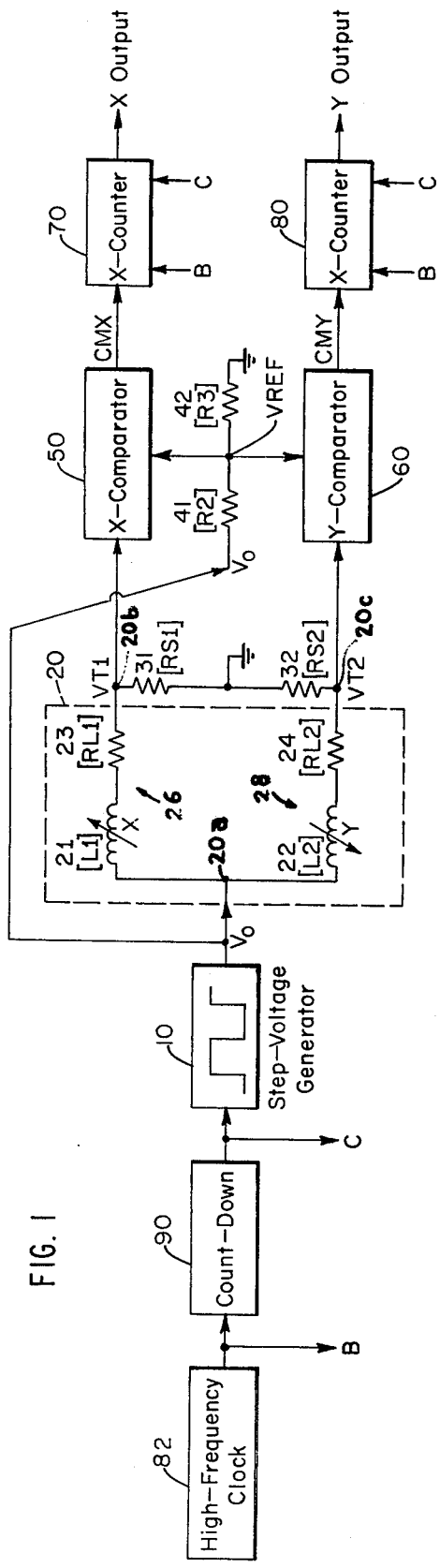
FIG. 1 is a block diagram of a digital displacement transducer according to the invention employing voltage-step excitation and electronic comparison of the resulting transient responses of the inductive legs of a differential inductance type transducer.

While this invention is applicable to a wide variety of displacement measuring instruments, the following description is directed to the measurement of angular rate as in a spring restrained gyro or an accelerometer. Referring to FIG. 1, a step-voltage or square wave generator 10 produces a periodically varying excitation voltage that is applied to a differential inductance transducer 20 at an input terminal 20a common to inductance legs 26 and 28. The leg 26 includes a variable inductance pick off coil 21 (with an inductance 21 (L1) and an internal resistance 23 (RL1) and a sense resistor 31

(RS1) connected in series with the coil 21). The leg 28 includes a variable inductance pick off coil 22 (with an inductance 22 (L2) and an internal resistance 24 (RL2) and a sense resistor 32 (RS2) connected in series with the coil 22). The sense resistors are connected at a common ground. The output of leg 26 is at a terminal 20b and the output of leg 28 is at a terminal 20c. The inductance legs thus form a three terminal inductance bridge with a common input.

The transducer senses an angular displacement through the pick up coils 21 and 22 since an angular displacement causes a corresponding change in the inductances L1 and L2 of the coils 21 and 22, respectively. For example, clockwise rotation of the transducer can cause the magnitude of L2 to increase and that of L1 to decrease, while for counterclockwise rotation the opposite occurs. A combination of a high-frequency clock 82 and a digital countdown unit 90 connected between the clock and the generator 10 synchronize the generator to provide a selected number of clock pulses between successive voltage steps. The generator produces a train of square wave pulses at regular intervals and with each pulse having a constant maximum voltage VO.

Each inductive leg of the transducer develops a transient response VT1 or VT2 to the voltage step that is proportional to the displacement that the transducer is experiencing by virtue of the relative change in the inductive values of the coils 21 and 22. The transient voltage response VT1 is sensed at the output terminal 20b of leg 26 and the transient voltage response VT2 is sensed at the output terminal 20C of leg 28. These transient responses are completely characterized by time constants T1 and T2 which are functions of the instantaneous value of L1 and L2, respectively, and their associated resistances. Thus this excitation produces high-frequency sampling of the instantaneous values of T1 and T2, which are directly related to the relative angular positions of a rotor and stator (not shown) of the instrument.

Figure 2:
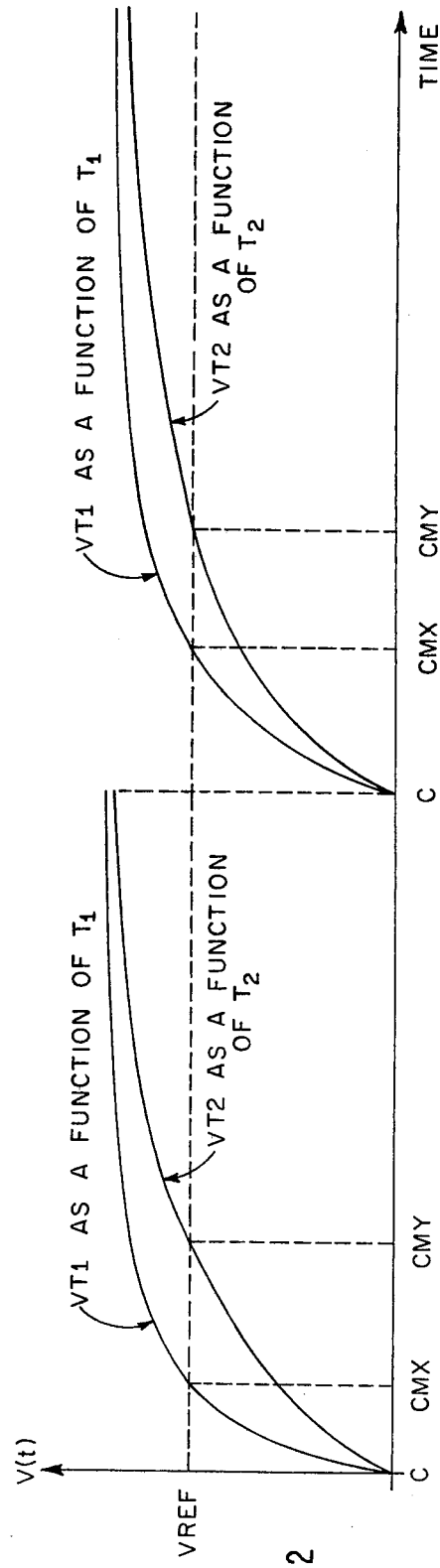
FIG. 2 is a graph showing two consecutive samplings of the transient response outputs of the two inductance legs with time constants $T_1$ and $T_2$ as well as the resulting comparison signals CMX and CMY produced by the comparators.

High-speed comparators 50 and 60 compare the voltages VT1 and VT2, respectively, at the sense resistors with a reference voltage VREF supplied by the passive voltage-divider consisting of resistors 41 (R2) and 42 (R3). The voltage divider provides a selected ratio of the step-voltage, VO. Comparison timing signals CMX and CMY are emitted by X-comparator 50 and Y-comparator 60, respectively, when the voltage VT1 and VT2 sensed in the corresponding leg becomes equal to the reference voltage, VREF. FIG. 2 graphically demonstrates this sampling process for two consecutive timing intervals.

The timing signals CMX and CMY produced by the comparators are converted by up/down counters 70 and 80, respectively, into numbers representing the sampled transducer leg time constants T1 and T2, respectively, by methods well-known to those familiar with the art. The counters are controlled by a countdown signal C produced by the digital countdown element 90 and indicating the start of the voltage step and the start of the CMX- and CMY-leg signals. The length of this interval is simply the number of clock counts B comprising the interval. The difference between the count at the output of the X-counter 70 and the count at the output of the Y-counter 80 is a measure of the magnitude of the physical angular displacement. The sense of direction of displacement can be readily monitored by a set-reset flip flop which detects changes in the order of occurrence of the CMX and CMY signals. For example, a change in direction may cause the instantaneous value of T1 to fall from a level greater than T2 to one less than T2 thus causing CMX to occur before CMY.

As an example of the high resolution provided by the present invention, using currently-available circuit elements, a minimum clock rate of 3.125 MHz will provide resolution of 1 part in 20,000 or 0.01 to 0.001% of full scale angular motion. This is equivalent to the 1 microradian resolution provided by a 15-bit analog to digital converter when a spring restrained angular rate sensor is deployed in the conventional AC mode.

Another significant advantage of the present invention is that it permits all circuitry to be housed in close proximity to the instrument thus maintaining a low noise level. This avoids bulky external circuitry associated with the prior art systems. This greatly limits the extraneous noise associated with coupling, wiring and grounding of this external circuitry as well as the noise introduced in the extensive peripheral circuitry itself.

The displacement transducer of this invention also maintains high resolution accuracy over a wide range of operating temperatures. Thermal performance is limited primarily by the thermal sensitivity of the transducer's inductors and their associated resistors. The following microprocessor compensation and autocalibration technique minimizes that effect; the analysis also shows how to use the measured time constants of the individual inductors to provide full scale-factor compensation.

With reference to FIG. 1, the inductive leg time constants $T_1 = L1/(RL1+RS1)$ and $T_2 = L2/(RL2+RS2)$ are being continuously sampled and signals derived from their values are supplied to the microprocessor. The transducer's scale factor is the rate of change of the average leg time constant, $T = (T1+T2)/2$, as a function of change in the angular position $\theta$ of the transducer, i.e., $dT/d\theta$. As T depends on an equivalent inductance, L, and an equivalent resistance, R, both of the latter of which are temperature sensitive, T itself is temperature dependent. Thus, the temperature dependence of the scale factor can be related to that of L and R by $$dT/d\theta = d(L/R)/d\theta = \frac{R\,dL/d\theta - L\,dR/d\theta}{R^2} \qquad (1)$$

The magnetic circuit geometry of the differential inductive transducer yields the relation $$\Delta L/L = K_1 \Delta \eta$$

where $K_1$ is a measureable proportionality constant supplied by the manufacturer of the differential inductive transducer. This latter equation may be rewritten as $$\Delta L/\Delta\theta = K_1 L \qquad (2)$$

The AC portion of the transducer's inductance which varies with inductance, $R_{AC}$, can similarly be related to changes in angular position, $\Delta R_{AC}/\Delta\theta$, by noting that $\Delta R_{AC}/\Delta\theta$ is proportional to magnetic field level which is, in turn, proportional to L, hence $$\Delta R_{AC}/\Delta\theta = K_2 L \qquad (3)$$

where $K_2$ is a measurable constant supplied by the manufacturer of the transducer.

Substituting equations (2) and (3) in equation (1) gives $$dT/d\theta = (RK_1L - LK_2L)/R^2 = K_1(L/R) - K_2(L^2/R^2)$$

Thus the instrument's scale factor can be calculated by the formula $$\text{scale factor} = K_1T - K_2T^2 \qquad (4)$$

where both $K_1$ and $K_2$ are temperature-independent constants, and only T is temperature-dependent. The first term accounts for primary changes in inductance and resistance, while the second term accounts for the change in resistive losses due to magnetic field changes.

As mentioned above, the values upon which T depends, T1 and T2, are being continuously sampled and are available to the microprocessor. As time progresses, and with changes in temperature, the value of T will change. As needed, then, new values of the scale factor can thus be calculated by the microprocessor using equation (4). Because temperature change will occur relatively infrequently compared with positional changes, recalculation of the scale factor is necessary at only some preselected number of leg time-constant sampling intervals. Hence, scale-factor compensation over a wide range of temperatures can be provided by a software program in the microprocessor, providing a high degree of accuracy. At the same time, no additional equipment is needed to provide such compensation in contrast to methods normally used in such sensors.

What is claimed is:

1. Means for converting a displacement directly into a digital signal that accurately represents the magnitude of the displacement comprising,
   a differential inductive transducer having first and seconds legs that each include inductive and resistive elements, said legs being arranged in a bridge configuration with a common input and separate outputs, and said inductive elements of each of said legs having a variable inductance,
   means for producing and applying an electrical excitation signal to said common input, said signal being a train of step-voltage pulses of substantially constant maximum amplitude and pulse interval, said excitation signal producing first and second transient signals at said outputs of said first and second legs, respectively,
   means for producing a constant reference voltage associated with said excitation signal,
   means for producing a timing signal associated with each of said legs that is derived from a comparison of said transient output signal to the reference voltage, said transient signal having a duration that corresponds to the time constant of the leg and is a direct measure of the instantaneous displacement of said leg, and
   means for converting said timing signals into a digital count.

2. The converting means of claim 1 further comprising means for comparing the digital count associated with each of said legs to provide an instantaneous digital representation of the magnitude and direction of said displacement.

3. The converting means of claim 1 wherein said inductive and resistive elements in each of said legs comprises a pickup coil and a sense resistor connected in series with said coil.

4. The converting means of claim 3 wherein said pickup coils are connected at said input, said sense resistors are commonly grounded, and said first and second outputs are at the connection between said coils and said sense resistors.

5. The converting means of claim 1 wherein said excitation signal means comprises a step-voltage generator.

6. The converting means of claim 5 further comprising a high frequency clock and an associated digital count-down device that control the pulse intervals applied by said generator to said input.

7. The converting means of claim 5 wherein said reference voltage means comprises a passive voltage divider network connected to the output of said generator to provide as reference voltages a selected ratio of said constant maximum amplitude of said step-voltage pulses.

8. The converting means of claim 1 wherein said timing signal means comprises first and second comparators which each receive as inputs said first and second transient signals, respectively, and their associated reference voltage and emit an electronic signal when said transient signal equals said reference voltage.

9. The converting means of claim 6 wherein said timing signal converting means comprises first and second counting means operating under the control of said clock and said count-down device.

10. The method of operating a differential inductive electro-mechanical transducer of the type comprising two motion-sensing variable inductances that directly convert changes in the physical position of a body into a high-accuracy digital representation of the magnitude and direction of said displacement, said method comprising the steps of:
    forming an input terminal of said transducer by connecting the two said inductances at a common point,
    forming a pair of output terminals of said transducer by connecting a resistor in series with each said inductance,
    exciting the three-terminal transducer so formed at its input terminal by a step voltage,
    providing a reference voltage,
    comparing the transient response at each said output terminal to said input step voltage against said reference voltage,
    emitting a first and second comparison signal when each said transient response equals said reference voltage, the difference in time between said signals being proportional to said physical displacement, and
    converting the difference in said comparison signals into said high-accuracy digital representation of the displacement of said body.

11. The method according to claim 10, wherein said high accuracy digital representation is maintained over the full range of operating temperatures of said transducer by a further scale factor temperature compensation step comprising the steps of:
    determining the average, T, of the elapsed times between said step-voltage excitation and each of said first and second comparison signals, and
    inputting said average T and the two constants $K_1$ and $K_2$, being the differential inductive transducer's manufacturer-supplied magnetic circuit geometry proportionality constant and the magnetic field level proportionality constant, respectively, to a digital microprocessor and computing the scale-factor by means of the formula $S.F. = K_1T - K_2T^2$.

* * * * *

UNITED STATES PATENT AND TRADEMARK OFFICE
CERTIFICATE OF CORRECTION

PATENT NO. : 4,364,045
DATED : December 14, 1982
INVENTOR(S) : Leo Spiegel

It is certified that error appears in the above-identified patent and that said Letters Patent are hereby corrected as shown below:

Column 4, line 52, the equation "$\Delta L/L = K_1 \Delta \eta$" should be changed to --$\Delta L/L = K_1 \Delta \theta$--.

Signed and Sealed this

Eighth Day of March 1983

[SEAL]

Attest:

Attesting Officer

GERALD J. MOSSINGHOFF

Commissioner of Patents and Trademarks